(12) United States Patent
Shimamune (10) Patent No.: US 10,361,669 B2
(45) Date of Patent: Jul. 23, 2019

(54) OUTPUT CIRCUIT

(71) Applicant: Murata Manufacturing Co., Ltd., Kyoto (JP)

(72) Inventor: Yusuke Shimamune, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/033,993

(22) Filed: Jul. 12, 2018

(65) Prior Publication Data

US 2018/0323761 A1 Nov. 8, 2018

Related U.S. Application Data

(62) Division of application No. 15/467,598, filed on Mar. 23, 2017, now Pat. No. 10,050,592.

(30) Foreign Application Priority Data

May 16, 2016 (JP) .................... 2016-098030

(51) Int. Cl.
*H03K 3/00* (2006.01)
*H03F 3/45* (2006.01)
(Continued)

(52) U.S. Cl.
CPC ....... *H03F 3/45475* (2013.01); *H03F 1/0211* (2013.01); *H03F 3/19* (2013.01); *H03F 3/195* (2013.01); *H03F 3/21* (2013.01); *H03F 3/245* (2013.01); *H03F 3/68* (2013.01); *H03F 2200/312* (2013.01); *H03F 2200/451* (2013.01);
(Continued)

(58) Field of Classification Search
None
See application file for complete search history.

(56) References Cited

U.S. PATENT DOCUMENTS 6,388,477 B1 * 5/2002 Juang .................... H03F 3/2173
326/27
7,495,475 B2 * 2/2009 Suzuki ........... H03K 19/018528
326/62
(Continued)

FOREIGN PATENT DOCUMENTS

JP 2005-217562 A 8/2005
JP 2006-191332 A 7/2006
(Continued)

*Primary Examiner* — Long Nguyen
(74) *Attorney, Agent, or Firm* — Pearne & Gordon LLP (57) ABSTRACT

An output circuit includes a first transistor, a second transistor, an operational amplifier that outputs a control voltage, and a switch circuit that controls voltage output in accordance with a control signal. When the control signal is in a first state, the switch circuit supplies the control voltage to the gate of the first transistor to turn on the first transistor and electrically connects the drain of first transistor to the operational amplifier so that a first output voltage is output from the drain of the first transistor. When the control signal is in a second state, the switch circuit supplies the control voltage to the gate of the second transistor to turn on the second transistor and electrically connects the drain of the second transistor to the operational amplifier so that a second output voltage is output from the drain of the second transistor.

10 Claims, 8 Drawing Sheets

(51) Int. Cl.
*H03F 3/19* (2006.01)
*H03F 3/21* (2006.01)
*H03F 1/02* (2006.01)
*H03F 3/195* (2006.01)
*H03F 3/24* (2006.01)
*H03F 3/68* (2006.01)

(52) U.S. Cl.
CPC .. *H03F 2200/516* (2013.01); *H03F 2200/555* (2013.01)

(56) References Cited

U.S. PATENT DOCUMENTS

| | | | |
|---|---|---|---|
| 10,050,592 B2 * | 8/2018 | Shimamune | H03F 3/19 |
| 2006/0214729 A1 | 9/2006 | Furuya | |
| 2008/0048722 A1 * | 2/2008 | Suzuki | H03K 19/018528 326/83 |

FOREIGN PATENT DOCUMENTS

| | | |
|---|---|---|
| JP | 2006-270146 A | 10/2006 |
| JP | 2009-025044 A | 2/2009 |

* cited by examiner

OUTPUT CIRCUIT

This application claims priority from U.S. patent application Ser. No. 15/467,598, filed on Mar. 23, 2017, entitled "OUTPUT CIRCUIT", which claims priority from Japanese Patent Application No. 2016-098030 filed on May 16, 2016. The contents of these applications are incorporated herein by reference in their entireties.

BACKGROUND

The present disclosure relates to an output circuit. Mobile communication devices such as a mobile phones employ a power amplification circuit to amplify power of radio frequency (RF) signals to be transmitted to a base station. The power amplification circuit includes a bias circuit for supplying a bias voltage or bias current to an amplifier. In some cases, the power amplification circuit includes a plurality of amplifiers corresponding to a plurality of operation modes. In this power amplification circuit, the output path for the bias voltage or bias current is controlled to cause an amplifier corresponding to an operation mode to operate. For example, Japanese Unexamined Patent Application Publication No. 2005-217562 discloses a configuration for switching a bias voltage to be supplied to an amplifier by using a switch to cause an amplifier corresponding to an operation mode to operate.

The configuration disclosed in Japanese Unexamined Patent Application Publication No. 2005-217562 has a problem in that a voltage drop caused by the on-resistance of the switch occurs when a bias current flows through the switch, which may cause deterioration in the characteristics of the bias circuit.

BRIEF SUMMARY

Accordingly, it is an object of the present disclosure to provide an output circuit that prevents or reduces deterioration in characteristics caused by switching of the output of voltage or current.

An output circuit of the present disclosure includes a first transistor, a second transistor, an operational amplifier, and a switch circuit. The first transistor is configured to output a first output voltage or output current from a drain of the first transistor. The second transistor is configured to output a second output voltage or output current from a drain of the second transistor. The operational amplifier has a first input terminal and a second input terminal and is configured to output a control voltage corresponding to a difference between a reference voltage supplied to the first input terminal and an input voltage supplied to the second input terminal. The switch circuit controls an output of the first output voltage or output current and the second output voltage or output current in accordance with a control signal. When the control signal is in a first state, the switch circuit supplies the control voltage to a gate of the first transistor to turn on the first transistor, and electrically connects the drain of the first transistor to the second input terminal of the operational amplifier so that the first output voltage or output current, which corresponds to the reference voltage, is output from the drain of the first transistor. When the control signal is in a second state, the switch circuit supplies the control voltage to a gate of the second transistor to turn on the second transistor, and electrically connects the drain of the second transistor to the second input terminal of the operational amplifier so that the second output voltage or output current, which corresponds to the reference voltage, is output from the drain of the second transistor.

According to embodiments of the present disclosure, an output circuit that prevents, or reduces, deterioration in characteristics caused by switching of the output of voltage or current may be achieved.

Other features, elements, characteristics and advantages of the present disclosure will become more apparent from the following detailed description of embodiments of the present disclosure with reference to the attached drawings.

DETAILED DESCRIPTION

Embodiments of the present disclosure will be described in detail hereinafter with reference to the drawings. The same or similar elements are denoted by the same reference numerals and are not redundantly described herein.

First Embodiment

Figure 1:
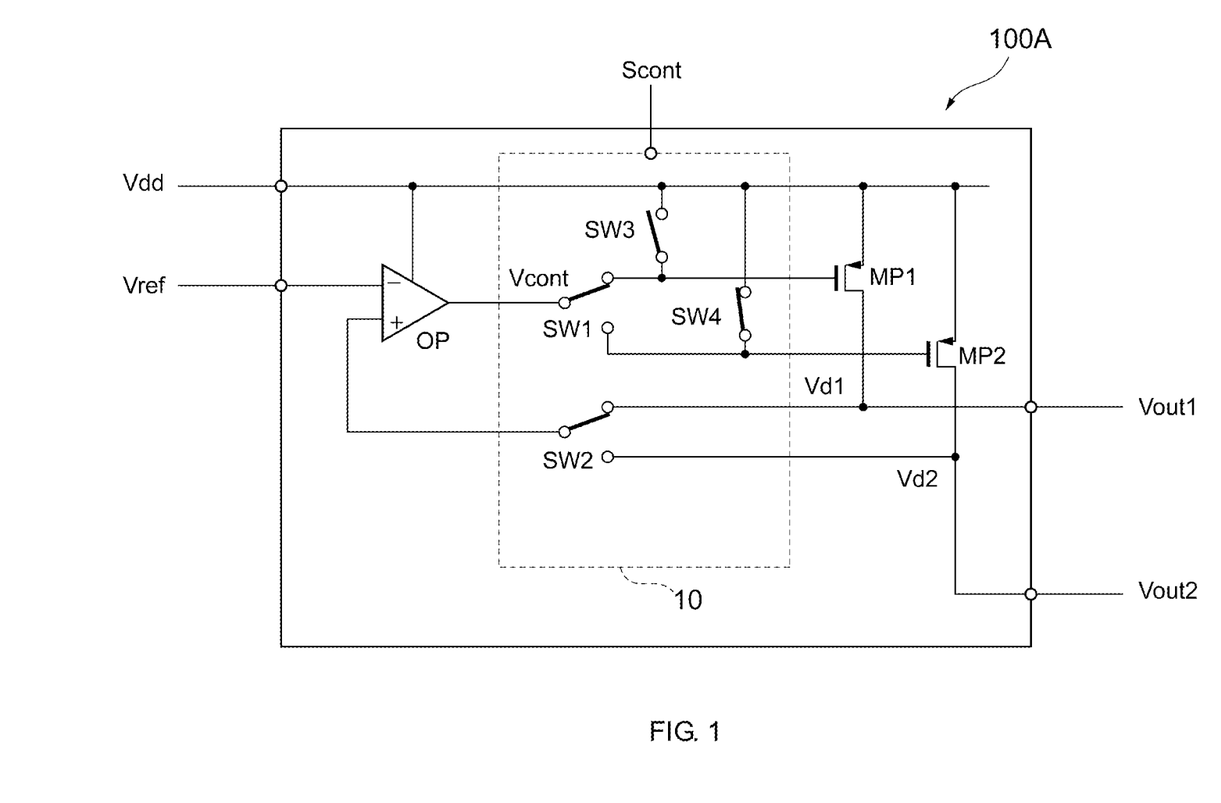
FIG. 1 is a circuit diagram of an output circuit according to a first embodiment of the present disclosure.

FIG. 1 illustrates an output circuit 100A that is an output circuit according to an embodiment of the present disclosure. The output circuit 100A outputs output voltages Vout1 and Vout2 having target levels on the basis of a predetermined reference voltage Vref. The output voltages Vout1 and Vout2 are used as respective bias voltages to be supplied to two power amplifiers (not illustrated), for example.

As illustrated in FIG. 1, the output circuit 100A includes an operational amplifier OP, a switch circuit 10, and P-channel metal-oxide-semiconductor field effect transistors (MOSFETs) (MP1 and MP2).

The operational amplifier OP has an inverting input terminal (first input terminal) supplied with the reference voltage Vref, a non-inverting input terminal (second input terminal) supplied with one voltage (input voltage) out of drain voltages Vd1 and Vd2 of the P-channel MOSFETs (MP1 and MP2), and an output terminal from which a control voltage Vcont is output. The imaginary short effect of the operational amplifier OP allows the operational amplifier OP to control the control voltage Vcont so that the drain voltages Vd1 and Vd2 of the P-channel MOSFETs (MP1 and MP2) have the same potential as the reference voltage Vref. The reference voltage Vref can be generated by using a band-gap reference circuit (not illustrated), for example.

The P-channel MOSFET (MP1) (first transistor) has a source supplied with a supply voltage Vdd, a gate supplied with the control voltage Vcont, and a drain from which the output voltage Vout1 (first output voltage) is output. The P-channel MOSFET (MP1) causes current to flow from the source to the drain in accordance with a gate-source voltage that is a difference between the gate voltage (=the control voltage Vcont) and the source voltage (=the supply voltage Vdd) to output the drain voltage Vd1.

Likewise, the P-channel MOSFET (MP2) (second transistor) has a source supplied with the supply voltage Vdd, a gate supplied with the control voltage Vcont, and a drain from which the output voltage Vout2 (second output voltage) is output. The P-channel MOSFET (MP2) causes current to flow from the source to the drain in accordance with a gate-source voltage that is a difference between the gate voltage (=the control voltage Vcont) and the source voltage (=the supply voltage Vdd) to output the drain voltage Vd2.

In the switch circuit 10, individual switches operate in accordance with a control signal Scont supplied from outside the switch circuit 10 to switch between the output voltages Vout1 and Vout2. The switch circuit 10 includes switches SW1, SW2, SW3, and SW4. In the following description, the control signal Scont indicates the on or off condition of the P-channel MOSFETs (MP1 and MP2), representing 1 for the on condition and 0 for the off condition.

The switch SW1 (first switch) operates so that a first end thereof is connected to the output terminal of the operational amplifier OP and a second end thereof is connected to the gate of one of the P-channel MOSFETs (MP1 and MP2). Specifically, when the control signal Scont is in a first state (for example, (MP1, MP2)=(1, 0)), the second end of the switch SW1 is connected to the gate of the P-channel MOSFET (MP1). When the control signal Scont is in a second state (for example, (MP1, MP2)=(0, 1)), the second end of the switch SW1 is connected to the gate of the P-channel MOSFET (MP2). This configuration allows the control voltage Vcont output by the operational amplifier OP to be supplied to the gate of one of the P-channel MOSFETs (MP1 and MP2).

The switch SW2 (second switch) operates so that a first end thereof is connected to the non-inverting input terminal of the operational amplifier OP and a second end thereof is connected to the drain of one of the P-channel MOSFETs (MP1 and MP2). Specifically, when the control signal Scont is in a first state (for example, (MP1, MP2)=(1, 0)), the second end of the switch SW2 is connected to the drain of the P-channel MOSFET (MP1). When the control signal Scont is in a second state (for example, (MP1, MP2)=(0, 1)), the second end of the switch SW2 is connected to the drain of the P-channel MOSFET (MP2). This configuration allows one of the respective drain voltages Vd1 and Vd2 of the P-channel MOSFETs (MP1 and MP2) to be supplied to the non-inverting input terminal of the operational amplifier OP. Accordingly, the operational amplifier OP and the P-channel MOSFETs (MP1 and MP2) constitute a negative feedback circuit.

The switches SW3 (third switch) and SW4 (fourth switch) respectively provide connection or disconnection between the gates of the P-channel MOSFETs (MP1 and MP2) and the supply voltage in accordance with the control signal Scont to switch between on and off of the P-channel MOSFETs (MP1 and MP2). Specifically, when the control signal Scont is in a first state (for example, (MP1, MP2)=(1, 0)), the switch SW4 is turned on to keep the gate voltage of the P-channel MOSFET (MP2) at the supply voltage Vdd (second voltage). Further, the switch SW3 is turned off to render the gate voltage of the P-channel MOSFET (MP1) controllable by the operational amplifier OP. This allows the P-channel MOSFET (MP1) to be turned on to cause current corresponding to the gate-source voltage to flow while keeping the P-channel MOSFET (MP2) in an off state. On the other hand, when the control signal Scont is in a second state (for example, (MP1, MP2)=(0, 1)), the switch SW3 is turned on to keep the gate voltage of the P-channel MOSFET (MP1) at the supply voltage Vdd (first voltage). Further, the switch SW4 is turned off to render the gate voltage of the P-channel MOSFET (MP2) controllable by the operational amplifier OP. This allows the P-channel MOSFET (MP2) to be turned on to cause current corresponding to the gate-source voltage to flow while keeping the P-channel MOSFET (MP1) in an off state.

In the switch circuit 10 described above, for example, when the control signal Scont is in a first state, the relationship of switch (SW1, SW2, SW3, SW4)=(MP1 side, MP1 side, off, on) is established, resulting in the relationship of P-channel MOSFET (MP1, MP2)=(on, off) being established (see FIG. 1). On the other hand, when the control signal Scont in a second state, the relationship of switch (SW1, SW2, SW3, SW4)=(MP2 side, MP2 side, on, off) is established, resulting in the relationship of P-channel MOSFET (MP1, MP2)=(off, on) being established. Accordingly, the output circuit 100A is able to selectively output one of the output voltages Vout1 and Vout2. Thus, for example, a mobile communication device includes the output circuit 100A as a power amplification circuit for switching the amplification mode (such as a low-power mode or a high-power mode) in accordance with the signal level of the input signal, which enables a bias voltage to be selectively supplied to any one of a plurality of power amplifiers. The switches SW1, SW2, SW3, and SW4 can be each implemented by using a transistor such as a MOSFET or a heterojunction bipolar transistor (HBT).

Next, a different circuit capable of switching an output voltage, which is a comparative example of the output circuit 100A, will be described with reference to FIG. 2.

Figure 2:
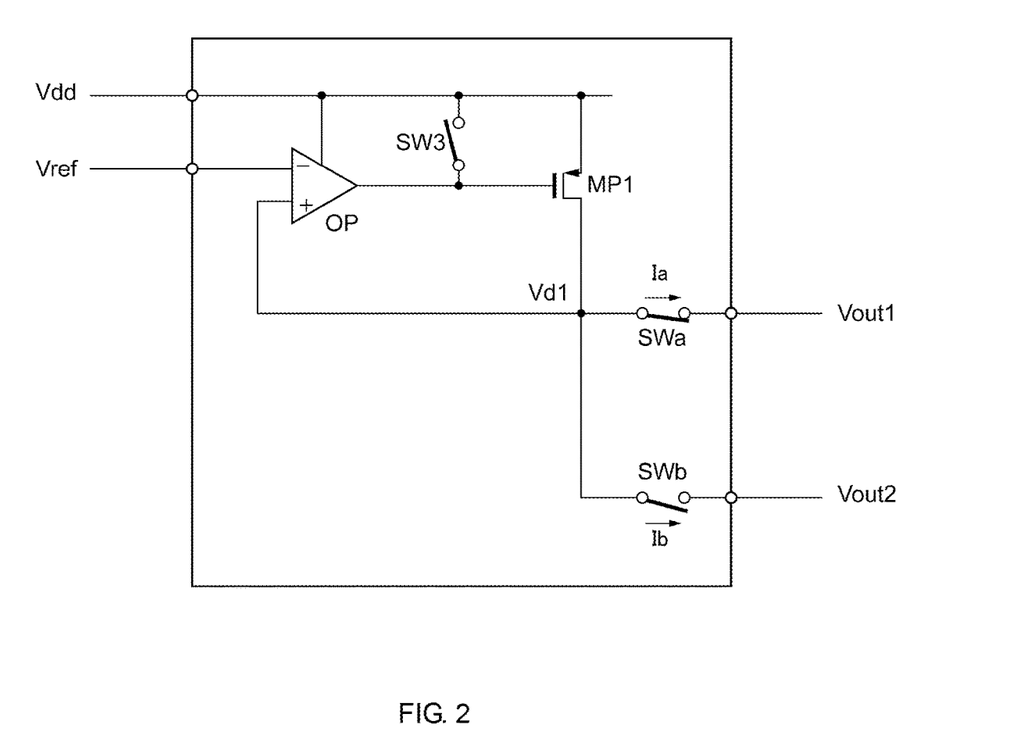
FIG. 2 is a circuit diagram illustrating a comparative example of the output circuit according to the first embodiment of the present disclosure.

FIG. 2 is a circuit diagram illustrating a comparative example of the output circuit 100A according to the first embodiment of the present disclosure. Compared to the output circuit 100A, the illustrated circuit in the comparative example does not include the P-channel MOSFET (MP2) and the switches SW1, SW2, and SW4 but includes switches SWa and SWb instead.

In the comparative example illustrated in FIG. 2, the P-channel MOSFET (MP1) and the operational amplifier OP constitute a negative feedback circuit. In addition, a complementary on and off status of the switches SWa and SWb allows an output voltage Vout1 or an output voltage Vout2 to be output.

For example, the switches SWa and SWb are constituted by transistors and the switches SWa and SWb have on-resistances ra and rb, respectively. In this case, when the switches SWa and SWb are turned on, currents Ia and Ib flow, causing voltage drops given by ra×Ia and rb×Ib, respectively. Thus, the output voltages Vout1 and Vout2 are respectively represented by Vout1=Vd1−ra×Ia and Vout2=Vd1−rb×Ib, which are lower than the voltage Vd1.

In contrast, the output circuit 100A illustrated in FIG. 1 is able to switch between the output voltages Vout1 and Vout2 without necessarily using the switch SWa or SWb illustrated in FIG. 2. Specifically, the drains of the P-channel MOSFETs (MP1 and MP2) are connected directly to output terminals without necessarily using switches or the like, resulting in the drain voltages Vd1 and Vd2 being output directly as the output voltages Vout1 and Vout2, respectively. This can prevent a voltage drop caused by the internal resistance of the switches SWa and SWb and a drop of the output voltages caused by the voltage drop, compared to the comparative example illustrated in FIG. 2, preventing or reducing deterioration in the characteristics of the output circuit. In addition, no consideration is given to a voltage drop, facilitating designing.

In the comparative example illustrated in FIG. 2, the output current of the P-channel MOSFET (MP1) flows through the switches SWa and SWb. This output current is much larger than the current flowing between the P-channel MOSFET (MP1) and the operational amplifier OP via the switches SW1 and SW2 illustrated in FIG. 1. Thus, the switches SWa and SWb need to be constructed by using transistors whose element sizes are larger than those of the switches SW1 and SW2 (for example, transistors whose element sizes are about several tens to hundreds of times greater than the element sizes of the switches SW1 and SW2 illustrated in FIG. 1). In the comparative example, therefore, transistors having comparatively large element sizes need to be used as three elements, namely, the P-channel MOSFET (MP1) and the switches SWa and SWb, leading to an increase in circuit area.

In the output circuit 100A illustrated in FIG. 1, in contrast, current is caused to flow through two elements, namely, the P-channel MOSFETs (MP1 and MP2). In addition, even if the switches SW1, SW2, SW3, and SW4 are constituted by transistors, the current flowing through these switches is minute. Thus, transistors whose element sizes are comparatively small (for example, transistors having a minimum size) can be used as the switches SW1, SW2, SW3, and SW4. Accordingly, even though the output circuit 100A includes a larger number of switches than the comparative example illustrated in FIG. 2, the circuit area of the output circuit 100A can be reduced in its entirety.

While the output circuit 100A includes two P-channel MOSFETs, the number of P-channel MOSFETs is not limited to two. The output circuit 100A may include more than two P-channel MOSFETs. In this case, it is possible to increase the number of output voltages in accordance with the number of P-channel MOSFETs.

Second Embodiment

Figure 3:
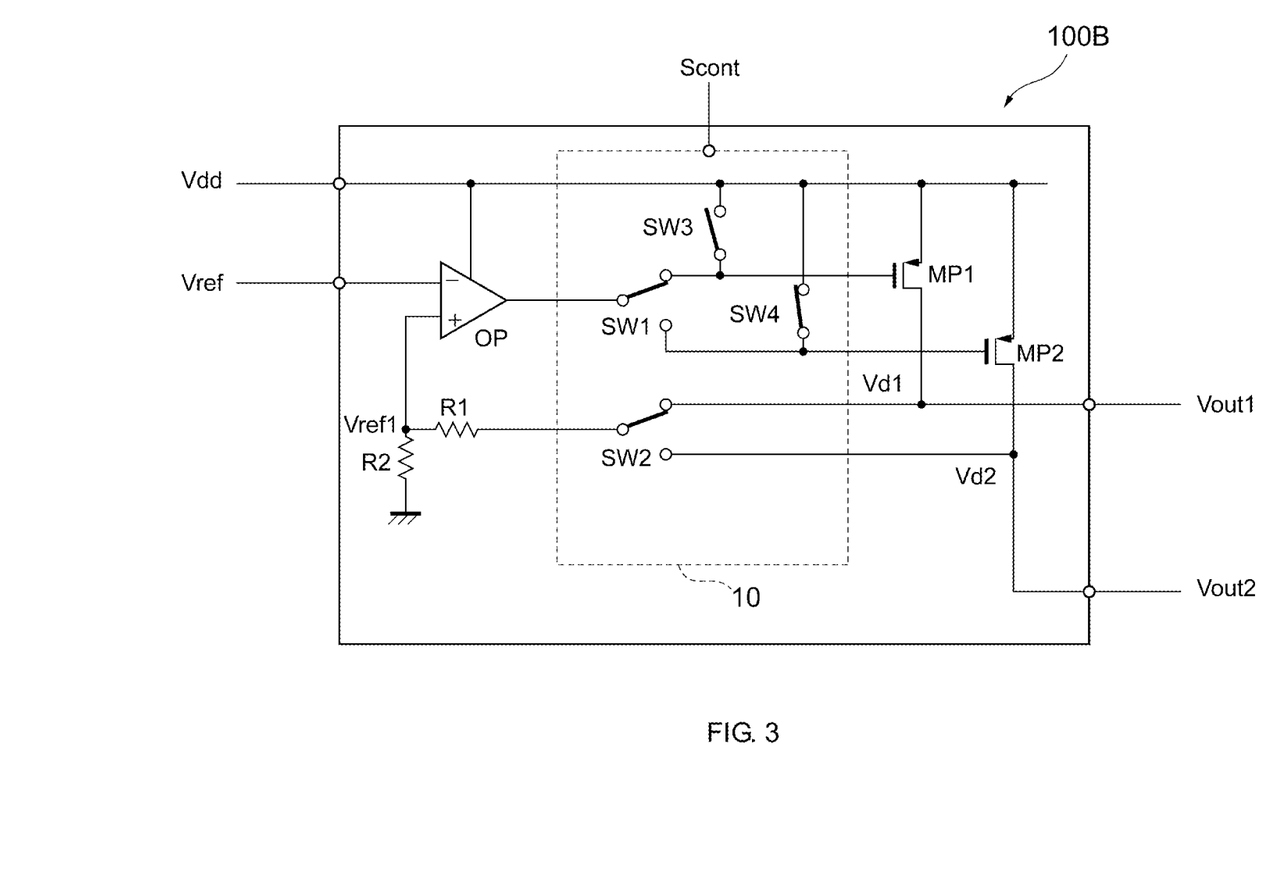
FIG. 3 is a circuit diagram of an output circuit according to a second embodiment of the present disclosure.

FIG. 3 illustrates an output circuit 100B that is an output circuit according to another embodiment of the present disclosure. Elements that are the same as or similar to those of the output circuit 100A are denoted by the same reference numerals and are not described herein.

The output circuit 100B is substantially the same as the output circuit 100A illustrated in FIG. 1, except that the output circuit 100B further includes resistance elements R1 and R2.

The resistance element R1 (first resistance element) has a first end connected to the non-inverting input terminal of the operational amplifier OP and a second end connected to the first end of the switch SW2.

The resistance element R2 (second resistance element) has a first end connected to the first end of the resistance element R1 and a second end connected to ground.

In the output circuit 100B, for example, when the P-channel MOSFET (MP1, MP2)=(on, off) is established, a voltage Vref1, which is obtained by dividing the drain voltage Vd1 of the P-channel MOSFET (MP1) in accordance with the resistance values of the resistance elements R1 and R2, is supplied to the non-inverting input terminal of the operational amplifier OP (see FIG. 3). Specifically, letting the on-resistance of the switch SW2 be rs2, the resistance value of the resistance element R1 be r1, and the resistance value of the resistance element R2 be r2, the voltage Vd1 is given by $Vd1=((rs2+r1+r2)/r2) \times Vref1$. Due to the imaginary short effect of the operational amplifier OP, the operational amplifier OP operates so that Vref=Vref1 holds. In the output circuit 100B, therefore, the output voltage Vout1 is given by $Vout1=((rs2+r1+r2)/r2) \times Vref$. The operation when the P-channel MOSFET (MP1, MP2)=(off, on) is established is similar to that when the P-channel MOSFET (MP1, MP2)=(on, off) is established, and thus is not described in detail herein. This configuration can also achieve advantages similar to those of the output circuit 100A. In addition, the output voltages Vout1 and Vout2 can be adjusted by adjusting the resistance values of the resistance elements R1 and R2.

Third Embodiment

Figure 4:
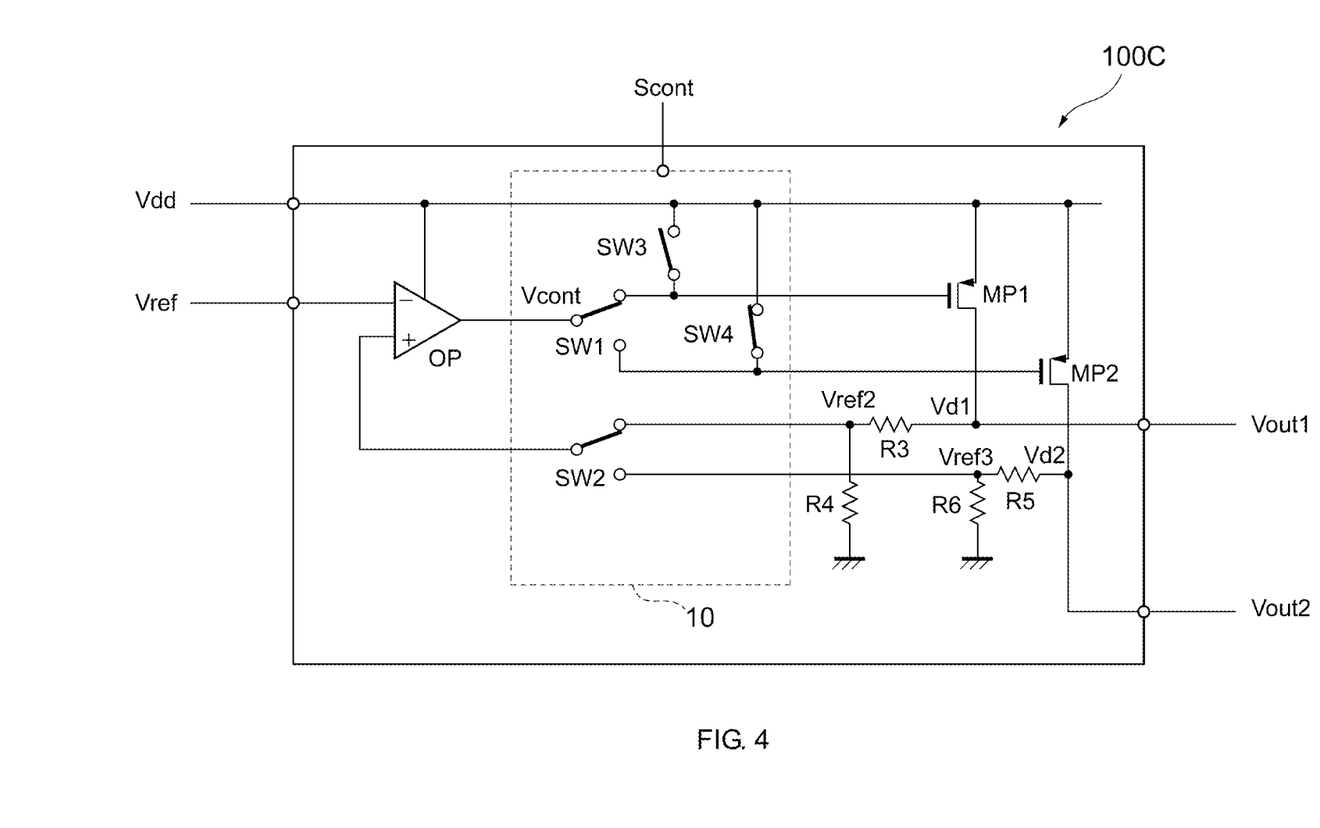
FIG. 4 is a circuit diagram of an output circuit according to a third embodiment of the present disclosure.

FIG. 4 illustrates an output circuit 100C that is an output circuit according to still another embodiment of the present disclosure. Elements that are the same as or similar to those of the output circuit 100A are denoted by the same reference numerals and are not described herein.

The output circuit 100C is substantially the same as the output circuit 100B illustrated in FIG. 3, except that the output circuit 100C includes resistance elements R3 to R6 instead of the resistance elements R1 and R2.

The resistance element R3 (third resistance element) has a first end connected to the second end of the switch SW2 on the P-channel MOSFET (MP1) side and a second end connected to the drain of the P-channel MOSFET (MP1).

The resistance element R4 (fourth resistance element) has a first end connected to the first end of the resistance element R3 and a second end connected to ground.

The resistance element R5 (fifth resistance element) has a first end connected to the second end of the switch SW2 on the P-channel MOSFET (MP2) side and a second end connected to the drain of the P-channel MOSFET (MP2).

The resistance element R6 (sixth resistance element) has a first end connected to the first end of the resistance element R5 and a second end connected to ground.

In the output circuit 100C illustrated in FIG. 4, the arrangement of the resistance elements R3 and R4 and the resistance elements R5 and R6 is different from that of the resistance elements R1 and R2 in the output circuit 100B illustrated in FIG. 3. Specifically, in the output circuit 100B, the resistance element R1 is located between the switch SW2 and the operational amplifier OP, whereas, in the output circuit 100C, the resistance elements R3 and R5 are respectively located between the drains of the P-channel MOSFETs (MP1 and MP2) and the switch SW2. Thus, letting the resistance value of the resistance element R3 be r3 and the resistance value of the resistance element R4 be r4, the voltage Vd1 is given by $Vd1=((r3+r4)/r4) \times Vref2$. Accordingly, the voltage Vref2 is determined without necessarily depending on the resistance value of the on-resistance of the switch SW2. This facilitates designing. A voltage Vref3 is similar to that of the voltage Vref2 and thus is not described in detail herein.

This configuration can also achieve advantages similar to those of the output circuit 100A. In addition, the output circuit 100C is more easily designed than the output circuit 100B.

Fourth Embodiment

Figure 5:
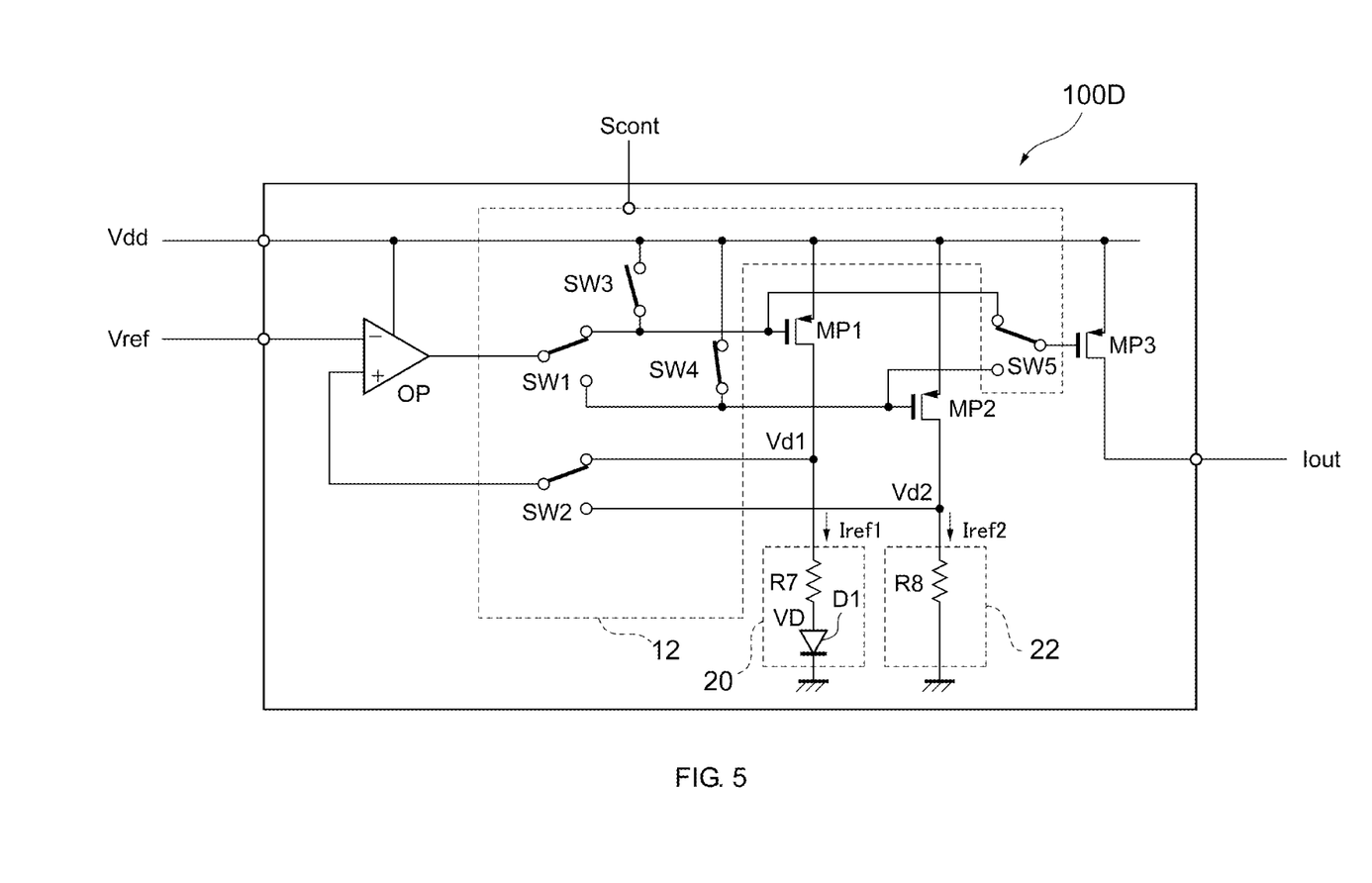
FIG. 5 is a circuit diagram of an output circuit according to a fourth embodiment of the present disclosure.

FIG. 5 illustrates an output circuit 100D that is an output circuit according to still another embodiment of the present disclosure. Elements that are the same as or similar to those of the output circuit 100A are denoted by the same reference numerals and are not described herein.

The output circuit 100D is substantially the same as the output circuit 100A illustrated in FIG. 1, except that the output circuit 100D further includes loads 20 and 22 and a P-channel MOSFET (MP3) in addition to the configuration of the output circuit 100A illustrated in FIG. 1 and includes a switch circuit 12 instead of the switch circuit 10.

The load 20 (first load) is connected between the drain of the P-channel MOSFET (MP1) and ground and causes a current Iref1 corresponding to the reference voltage Vref to flow through the drain of the P-channel MOSFET (MP1). In this embodiment, the load 20 can be constituted by, for example, a resistance element R7 (seventh resistance element) and a diode D1 that are connected in series. Letting the resistance value of the resistance element R7 be r7 and the anode voltage of the diode D1 be VD, the current Iref1 is given by Iref1=(Vd1−VD)/r7. The current Iref1 depends on the temperature characteristics of the anode voltage VD of the diode D1.

The load 22 (second load) is connected between the drain of the P-channel MOSFET (MP2) and ground and causes a current Iref2 corresponding to the reference voltage Vref to flow through the drain of the P-channel MOSFET (MP2). In this embodiment, the load 22 can be constituted by, for example, a resistance element R8 (eighth resistance element). Letting the resistance value of the resistance element R8 be r8, the current Iref2 is given by Iref2=Vd2/r8.

The components of the loads 20 and 22 are not limited to those described above, and a load that allows a certain current to flow through the drains of the P-channel MOSFETs (MP1 and MP2) may be used.

The switch circuit 12 further includes a switch SW5 in addition to the configuration of the switch circuit 10. The switch SW5 (fifth switch) has a first end connected to the gate of the P-channel MOSFET (MP3) and a second end connected to the gate of the P-channel MOSFET (MP1) or the gate of the P-channel MOSFET (MP2). The switch SW5 is connected in accordance with the control signal Scont, which is supplied from outside, such that, when the control signal Scont is in a first state (for example, (MP1, MP2)=(1, 0)), the second end of the switch SW5 is connected to the gate of the P-channel MOSFET (MP1) and, when the control signal Scont is in a second state (for example, (MP1, MP2)=(0, 1)), the second end of the switch SW5 is connected to the gate of the P-channel MOSFET (MP2).

The P-channel MOSFET (MP3) (third transistor) is connected to the P-channel MOSFETs (MP1 and MP2) in a current-mirror configuration. Specifically, the P-channel MOSFET (MP3) has a source supplied with the supply voltage Vdd, a gate supplied with the gate voltage of the P-channel MOSFET (MP1 or MP2), and a drain from which an output current Iout (third output current) is output. This allows the output current Iout flowing through the drain of the P-channel MOSFET (MP3) to be equal to an amount of current corresponding to the size ratio of the P-channel MOSFET (MP3) to the P-channel MOSFET (MP1 or MP2). For example, the current density of the P-channel MOSFET (MP3) can be made the same as that of the P-channel MOSFET (MP1 or MP2). In this case, Iout=Iref1 or Iout=Iref2 is established.

Similarly to the output circuit 100A, the output circuit 100D having the configuration described above also allows switching of the output current Iout while preventing or reducing the deterioration in the characteristics of the output circuit caused by the insertion of switches.

The output circuit 100D may be included in, for example, a multimode (for example, 2G (second generation mobile communication system) and 3G (third generation mobile communication system)) mobile communication device. In such a mobile communication device, when providing the output current Iout to a power amplifier of the mobile communication device, the output circuit 100D can switch the output current Iout in accordance with the mode applied. Specifically, when one mode is applied, the P-channel MOSFET (MP1) can be turned on to output the output current Iout corresponding to the current Iref1, and, when the other mode is applied, the P-channel MOSFET (MP2) can be turned on to output the output current Iout corresponding to the current Iref2. This allows different characteristics (such as whether or not temperature characteristics are to be taken into consideration) to be selected depending on, for example, the mode applied.

In the output circuit 100D, one P-channel MOSFET is connected in a current-mirror configuration. However, the number of P-channel MOSFETs to be connected in a current-mirror configuration is not limited to one. Two or more P-channel MOSFETs may be connected in parallel.

Fifth Embodiment

Figure 6:
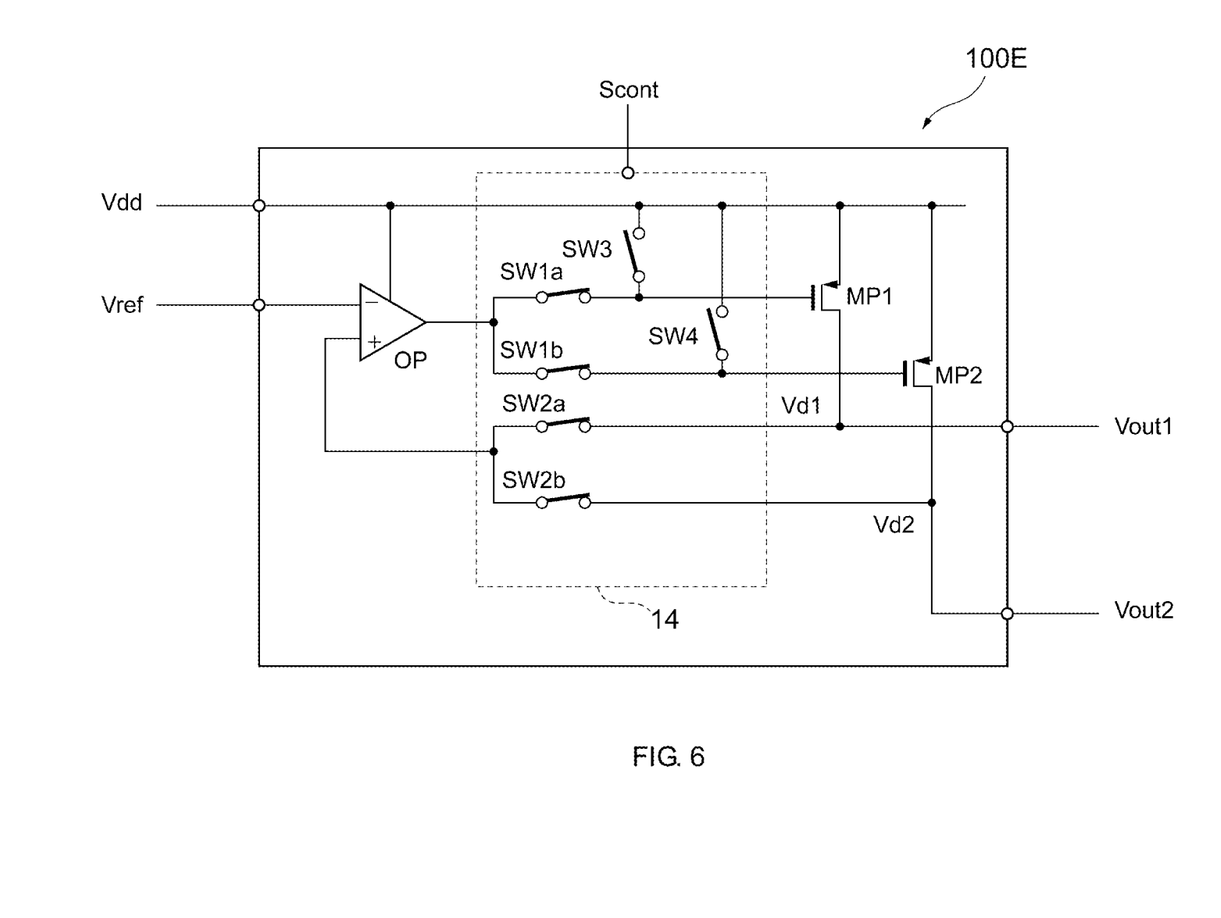
FIG. 6 is a circuit diagram of an output circuit according to a fifth embodiment of the present disclosure.

FIG. 6 illustrates an output circuit 100E that is an output circuit according to still another embodiment of the present disclosure. Elements that are the same as or similar to those of the output circuit 100A are denoted by the same reference numerals and are not described herein.

The output circuit 100E is substantially the same as the output circuit 100A illustrated in FIG. 1, except that the output circuit 100E includes a switch circuit 14 instead of the switch circuit 10. The switch circuit 14 includes switches SW1a, SW1b, SW2a, and SW2b instead of the switches SW1 and SW2 in the switch circuit 10.

The switches SW1a and SW1b (first switches) have first ends connected to the output terminal of the operational amplifier OP and second ends respectively connected to the gates of the P-channel MOSFETs (MP1 and MP2). Specifically, when the control signal Scont is in a first state (for example, (MP1, MP2)=(1, 0)), only the switch SW1a is turned on. When the control signal Scont is in a second state (for example, (MP1, MP2)=(0, 1)), only the switch SW1b is turned on. When the control signal Scont is in a third state (for example, (MP1, MP2)=(1, 1)), both the switches SW1a and SW1b are turned on.

The switches SW2a and SW2b (second switches) have first ends connected to the non-inverting input terminal of the operational amplifier OP and second ends respectively connected to the drains of the P-channel MOSFETs (MP1 and MP2). Specifically, when the control signal Scont is in a first state (for example, (MP1, MP2)=(1, 0)), only the switch SW2a is turned on. When the control signal Scont is in a second state (for example, (MP1, MP2)=(0, 1)), only the switch SW2b is turned on. When the control signal Scont is in a third state (for example, (MP1, MP2)=(1, 1)), both the switches SW2a and SW2b are turned on.

This configuration can also achieve advantages similar to those of the output circuit 100A.

Additionally, the output circuit 100E is different from the output circuit 100A illustrated in FIG. 1 in that the switches SW1a, SW1b, SW2a, and SW2b can be simultaneously turned on and the P-channel MOSFETs (MP1 and MP2) can be simultaneously turned on (see FIG. 6). Accordingly, for example, when the output circuit 100E is included in a carrier aggregation enabled mobile communication device, the output circuit 100E can simultaneously provide the output voltages Vout1 and Vout2 to a plurality of power amplifiers.

Sixth Embodiment

Figure 7:
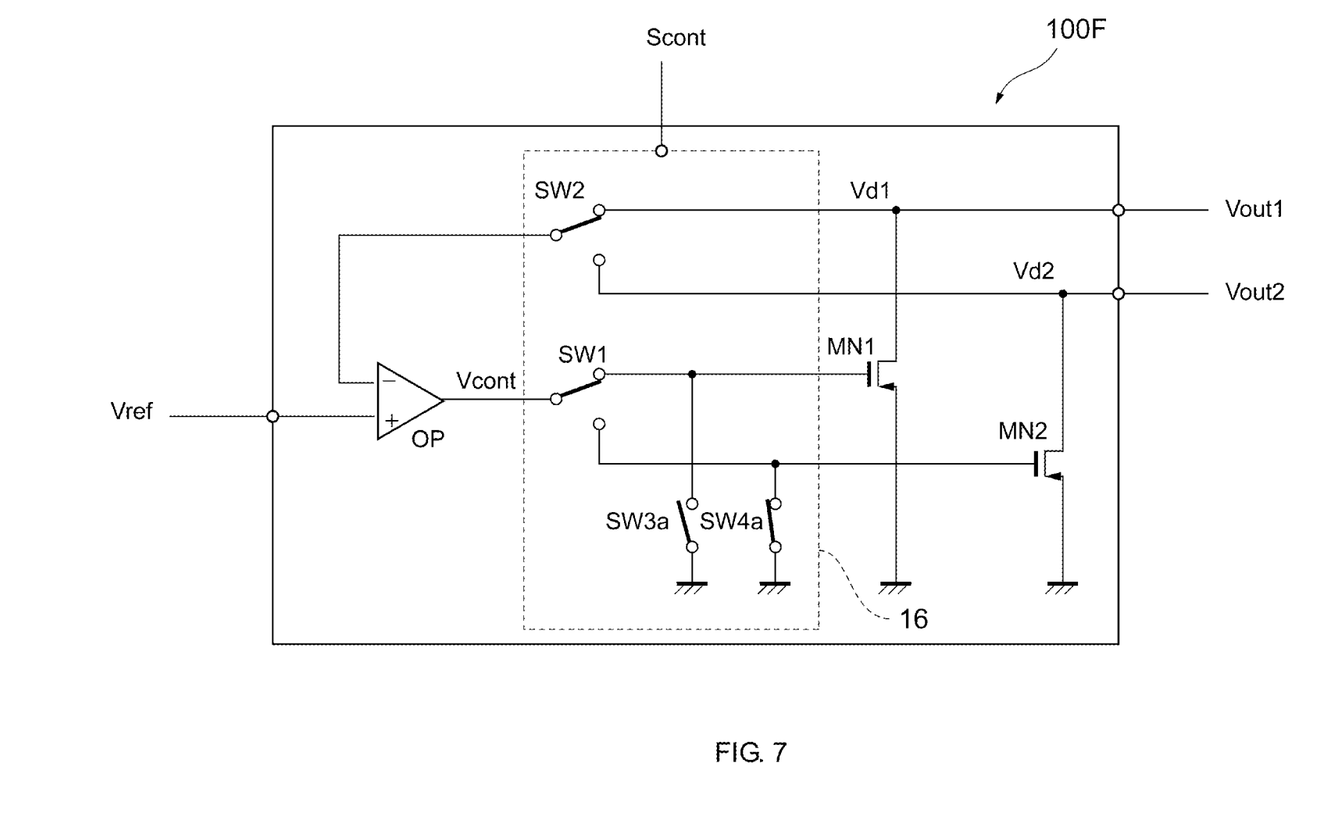
FIG. 7 is a circuit diagram of an output circuit according to a sixth embodiment of the present disclosure.

FIG. 7 illustrates an output circuit 100F that is an output circuit according to still another embodiment of the present disclosure. Elements that are the same as or similar to those of the output circuit 100A are denoted by the same reference numerals and are not described herein.

The output circuit 100F is substantially the same as the output circuit 100A illustrated in FIG. 1, except that the output circuit 100F includes N-channel MOSFETs (MN1 and MN2) instead of the P-channel MOSFETs (MP1 and MP2) and a switch circuit 16 instead of the switch circuit 10.

The N-channel MOSFET (MN1) (first transistor) has a source connected to ground, a gate supplied with the control voltage Vcont, and a drain from which the output voltage Vout1 is output. The N-channel MOSFET (MN1) causes current to flow from the drain to the source in accordance with a gate-source voltage that is a difference between the gate voltage (the control voltage Vcont) and the source voltage (ground potential) to output the drain voltage Vd1.

Likewise, the N-channel MOSFET (MN2) (second transistor) has a source connected to ground, a gate supplied with the control voltage Vcont, and a drain from which the output voltage Vout2 is output. The N-channel MOSFET (MN2) causes current to flow from the drain to the source in accordance with a gate-source voltage that is a difference between the gate voltage (the control voltage Vcont) and the source voltage (ground potential) to output the drain voltage Vd2.

The operational amplifier OP has a non-inverting input terminal (first input terminal) supplied with the reference voltage Vref, an inverting input terminal (second input terminal) supplied with one voltage out of the drain voltages Vd1 and Vd2 of the N-channel MOSFETs (MN1 and MN2), and an output terminal from which the control voltage Vcont is output.

The switch circuit 16 includes switches SW3a and SW4a instead of the switches SW3 and SW4 in the switch circuit 10.

The switches SW3a (third switch) and SW4a (fourth switch) respectively provide connection or disconnection between the gates of the N-channel MOSFETs (MN1 and MN2) and ground in accordance with the control signal Scont to control the turn-on and off of the N-channel MOSFETs (MN1 and MN2). A specific operation of the switches SW3a and SW4a is similar to that of the switches SW3 and SW4 illustrated in FIG. 1, and thus is not described in detail herein.

This configuration can also achieve advantages similar to those of the output circuit 100A, and N-channel MOSFETs may be used to configure an output circuit.

Application Example

Figure 8:
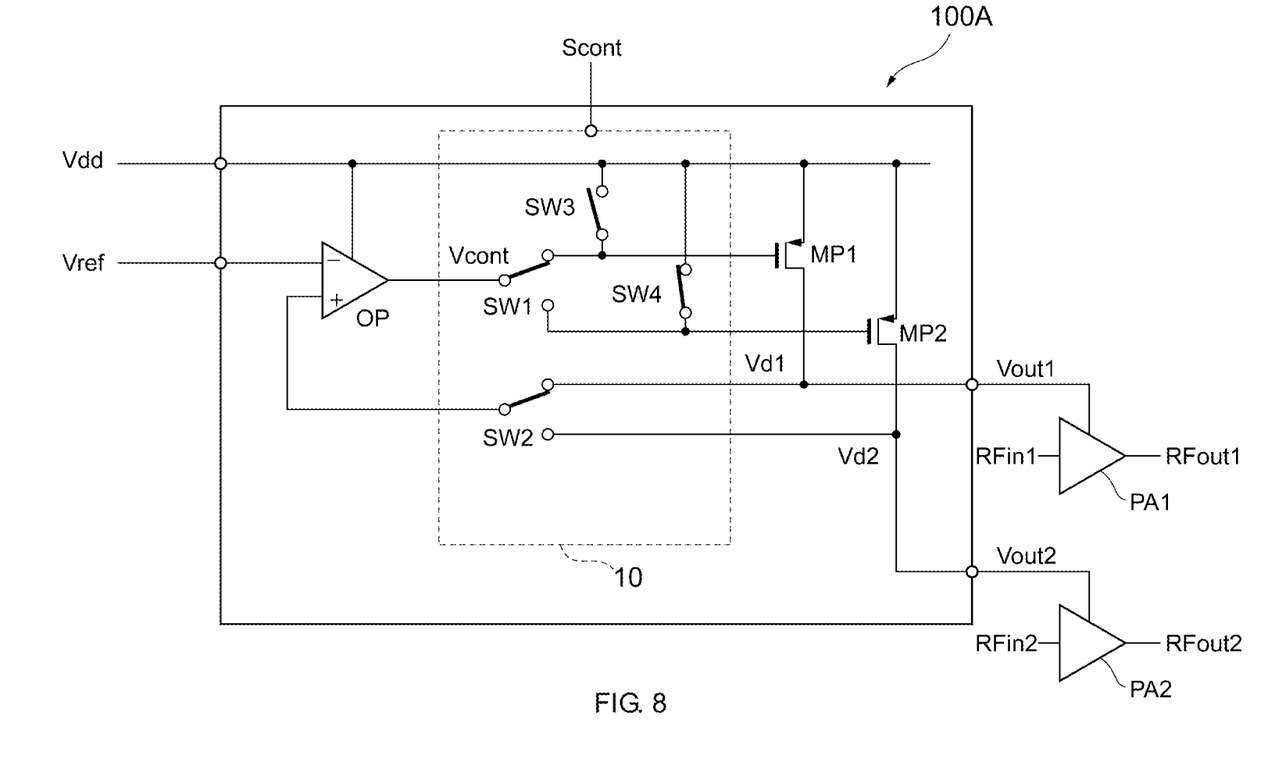
FIG. 8 illustrates an application example of the output circuit according to the first embodiment of the present disclosure.

FIG. 8 illustrates an application example of the output circuit 100A according to the first embodiment of the present disclosure. Elements that are the same as or similar to those of the output circuit 100A are denoted by the same reference numerals and are not described herein.

As illustrated in FIG. 8, the output circuit 100A can be used as a bias voltage output circuit for power amplifiers PA1 and PA2. The power amplifiers PA1 and PA2 may be each an amplifier that amplifies power of an RF signal in, for example, a mobile communication device such as a mobile phone. For example, the power amplifier PA1 amplifies an RF signal RFin1 to produce an RF signal RFout1 and outputs the RF signal RFout1. The power amplifier PA2 amplifies an RF signal RFin2 to produce an RF signal RFout2 and outputs the RF signal RFout2. The output voltages Vout1 and Vout2 output from the output circuit 100A are respectively supplied to the power amplifiers PA1 and PA2, and are respectively used as bias voltages of the power amplifiers PA1 and PA2. The switches SW1 to SW4 in the output circuit 100A may be switched to switch between the power amplifiers PA1 and PA2 to be activated. Additionally, the gain characteristics of the power amplifiers PA1 and PA2 may be controlled in accordance with the levels of the output voltages Vout1 and Vout2.

Similarly to the output circuit 100A, the output circuits 100B to 100F may be connected to power amplifiers and may be used as bias voltage or current output circuits. In addition, a circuit supplied with an output voltage or an output current is not limited to a power amplifier and may be any other amplifier such as a low-noise amplifier (LNA).

Exemplary embodiments of the present disclosure have been described. The output circuit 100A to 100F include the switch SW1 that switches the connection between the gate of one MOSFET among the plurality of P-channel MOSFETs (MP1 and MP2) or N-channel MOSFETs (MN1 and MN2) and the output terminal of the operational amplifier (OP), the switch SW2 that switches the connection between the drain of the one MOSFET and the input terminal of the operational amplifier, and the switches SW3 (SW3a) and SW4 (SW4a) that switch the turn-on and off of the MOSFETs. This configuration allows switching of a voltage or current having a predetermined level between a plurality of paths to output the voltage or current while preventing or reducing the deterioration in characteristics caused by switching of an output voltage or current.

In addition, as illustrated in FIG. 6, the output circuit 100E further includes the switches SW1aSW1b, SW2a, and SW2b that allow the P-channel MOSFETs (MP1 and MP2) to be simultaneously turned on. This configuration allows the output voltages Vout1 and Vout2 to be simultaneously output to a plurality of paths.

In addition, as illustrated in FIG. 3, the output circuit 100B includes the resistance element R1 connected between the switch SW2 and the input terminal of the operational amplifier OP, and the resistance element R2 having a first end connected to a node between the resistance element R1 and the operational amplifier OP, and a second end connected to ground. This configuration allows the output voltages Vout1 and Vout2 to be adjusted by adjusting the resistance values of the resistance elements R1 and R2.

In addition, as illustrated in FIG. 4, the output circuit 100C includes the resistance elements R3 and R5 respectively connected between the drains of the P-channel MOSFETs (MP1 and MP2) and the switch SW2, and the resistance elements R4 and R6 having first ends connected to a node between the resistance element R3 and the switch SW2 and a node between the resistance element R5 and the switch SW2, respectively, and second ends connected to ground. This configuration allows the output voltage Vout1 to be adjusted by adjusting the resistance values of the resistance elements R3 and R4. This configuration also allows the output voltage Vout2 to be adjusted by adjusting the resistance values of the resistance elements R5 and R6.

In addition, as illustrated in FIG. 5, the output circuit 100D further includes the P-channel MOSFET (MP3), which is connected to the P-channel MOSFETs (MP1 and MP2) in a current-mirror configuration, the switch SW5, and the loads 20 and 22. This configuration allows switching of the characteristics of the output current Iout.

As illustrated in FIG. 5, furthermore, the loads 20 and 22 can be constituted by, for example, the resistance elements R7 and R8 and the diode D1.

Similarly to the output circuit 100E, the output circuits 100A, 100B, 100C, 100D, and 100F may also be configured such that the switch circuit 14 is appropriately used to simultaneously turn on the P-channel MOSFETs (MP1 and MP2) or the N-channel MOSFETs (MN1 and MN2).

In addition, similarly to the output circuit 100F, the output circuits 100B, 100C, 100D, and 100E may also be configured by using N-channel MOSFETs instead of P-channel MOSFETs, as appropriate.

The embodiments described above are provided for easy understanding of the present disclosure, and it is not intended to limit the present disclosure to the embodiments only. Modifications and improvements may be made to the present disclosure without departing from the spirit of the present disclosure, and the equivalents thereof are also encompassed by the present disclosure. That is, these embodiments may be appropriately modified in design by those skilled in the art, and such modifications also fall within the scope of the present disclosure so long as the modifications include the features of the present disclosure. For example, the elements included in the embodiments described above and the arrangement, materials, conditions, shapes, sizes, and the like thereof are not limited to those described in the illustrated examples but can be modified appropriately. In addition, the elements included in the embodiments described above may be combined in any technically feasible manner and such combinations also fall within the scope of the present disclosure so long as the combinations include the features of the present disclosure.

While embodiments of the invention have been described above, it is to be understood that variations and modifications will be apparent to those skilled in the art without departing from the scope and spirit of the disclosure. The scope of the invention, therefore, is to be determined solely by the following claims.

What is claimed is:

1. An output circuit comprising:
   a first transistor configured to output a first output voltage or output current from a drain of the first transistor;
   a second transistor configured to output a second output voltage or output current from a drain of the second transistor;
   an operational amplifier having a first input terminal and a second input terminal and configured to output a control voltage corresponding to a difference between a reference voltage supplied to the first input terminal and an input voltage supplied to the second input terminal;
   a switch circuit that controls an output of the first output voltage or output current and the second output voltage or output current in accordance with a control signal, the switch circuit comprising:
      a first switch that supplies the control voltage to a gate of the first transistor when the control signal is in a first state and that supplies the control voltage to a gate of the second transistor when the control signal is in a second state,
      a second switch that electrically connects the drain of the first transistor to the second input terminal of the operational amplifier when the control signal is in the first state and that electrically connects the drain of the second transistor to the second input terminal of the operational amplifier when the control signal is in the second state,
      a third switch that supplies a first voltage to the gate of the first transistor to turn off the first transistor when the control signal is in the second state and that stops supply of the first voltage to the gate of the first transistor when the control signal is in the first state, and
      a fourth switch that supplies a second voltage to the gate of the second transistor to turn off the second transistor when the control signal is in the first state and that stops supply of the second voltage to the gate of the second transistor when the control signal is in the second state;
   a first load electrically connected between the drain of the first transistor and ground; and
   a second load electrically connected between the drain of the second transistor and ground,
   wherein when the control signal is in the first state, the first output voltage or output current is output from the drain of the first transistor, and
   wherein when the control signal is in the second state, the second output voltage or output current is output from the drain of the second transistor.

2. The output circuit according to claim 1, further comprising:
   a third transistor configured to output a third output current from a drain of the third transistor,
   wherein the switch circuit further comprises a fifth switch that connects a gate voltage of the first transistor to a gate of the third transistor when the control signal is in the first state and that connects a gate voltage of the second transistor to the gate of the third transistor when the control signal is in the second state.

3. The output circuit according to claim 1, wherein
   the first load comprises a seventh resistance element and a diode, the seventh resistance element and the diode being connected in series, and
   the second load comprises an eighth resistance element.

4. The output circuit according to claim 2, wherein
   the first load comprises a seventh resistance element and a diode, the seventh resistance element and the diode being connected in series, and
   the second load comprises an eighth resistance element.

5. The output circuit according to claim 1, wherein the first transistor and the second transistor are P-channel MOSFETs.

6. The output circuit according to claim 2, wherein the first transistor and the second transistor are P-channel MOSFETs.

7. The output circuit according to claim 2, wherein the first, second, and third transistors are P-channel MOSFETs.

8. The output circuit according to claim 1, wherein the first voltage is equal to the second voltage.

9. The output circuit according to claim 1,
   wherein the first output voltage or output current from the drain of the first transistor is supplied as a bias voltage or current, respectively, to a first power amplifier, and
   wherein the second output voltage or output current from the drain of the second transistor is supplied as a bias voltage or current, respectively, to a second power amplifier.

10. The output circuit according to claim 1, wherein the first input terminal of the operational amplifier is an inverting input and the second input terminal of the operational amplifier is a non-inverting input.

* * * * *